US006792585B1

(12) United States Patent
Ku et al.

(10) Patent No.: US 6,792,585 B1
(45) Date of Patent: Sep. 14, 2004

(54) METHOD AND APPARATUS OF RELATIVE DATAPATH CELL PLACEMENT WITH STRUCTURE BONDING

(75) Inventors: Tsu-Wei Ku, Cupertino, CA (US); Scot A. Woodward, Santa Clara, CA (US); Yung-Hung Wang, Mountain View, CA (US); Duan-Ping Chen, San Jose, CA (US); Wei-Kong Chia, Los Altos, CA (US)

(73) Assignee: Arcadia Design Systems, Inc., San Jose, CA (US)

( * ) Notice: Subject to any disclaimer, the term of this patent is extended or adjusted under 35 U.S.C. 154(b) by 0 days.

(21) Appl. No.: 09/491,389

(22) Filed: Jan. 26, 2000

(51) Int. Cl.[7] .............................. G06F 17/50; G06F 9/45
(52) U.S. Cl. ................... 716/10; 716/8; 716/13
(58) Field of Search ................. 716/10, 8, 13

(56) References Cited

U.S. PATENT DOCUMENTS

| | | | | |
|---|---|---|---|---|
| 4,577,276 A | * | 3/1986 | Dunlop et al. ............... | 716/10 |
| 5,218,551 A | | 6/1993 | Agrawal et al. | |
| 5,506,788 A | | 4/1996 | Cheng et al. | |
| 5,519,627 A | | 5/1996 | Mahmood et al. | |
| 5,619,419 A | | 4/1997 | D'Haeseleer et al. | |
| 5,627,999 A | * | 5/1997 | Cheng et al. ............... | 716/8 |
| 5,666,290 A | | 9/1997 | Li et al. | |
| 5,726,902 A | * | 3/1998 | Mahmood et al. ............... | 716/6 |
| 5,815,406 A | | 9/1998 | Golla et al. | |
| 5,844,811 A | | 12/1998 | Scepanovic et al. | |
| 5,930,499 A | * | 7/1999 | Chen et al. ............... | 716/8 |
| 6,148,433 A | * | 11/2000 | Chowdhary et al. ............... | 716/1 |
| 6,189,130 B1 | * | 2/2001 | Gofman et al. ............... | 716/7 |
| 6,594,808 B1 | * | 7/2003 | Kale et al. ............... | 716/8 |
| 6,598,215 B2 | * | 7/2003 | Das et al. ............... | 716/12 |
| 2002/0087939 A1 | * | 7/2002 | Greidinger et al. ............ | 716/2 |

OTHER PUBLICATIONS

M.C. Yildiz et al., Global Objectives for Standard Cell Placement, Proceedings of the 2001 Conference on Great lakes Symposium on VLSI, pp. 68–72, Mar. 2001.*

Tsu–Wei Ku et al., Minimal Overhead Modification of Iterative Logic Arrays for C–Testability, , IEEE Test Conference, pp. 964–969, Sep. 1990.*

H. Shiraishi et al., Efficient Placement and Routing Techniques for Master Slice LSI, Proceedings of the 14th Design Automation Conference, pp. 458–464, Jun. 1977.*

C–I Eric Cheng, RISA: Accurate and Efficient Placement Routability Modeling, IEEE/ACM International Conference on Computer–Aided Design, pp. 690–695, Nov. 1994.*

(List continued on next page.)

Primary Examiner—A. M. Thompson
(74) Attorney, Agent, or Firm—Fernandez & Associates, LLP; Dennis S. Fernandez (57) ABSTRACT

The invention discloses a relative structure placement of datapath of cell instances in a column structure, a row structure, or an array structure. To encourage placement of a desirable structure, pseudo cells, pseudo pins, and pseudo nets are selected to be placed at certain locations with respect to real cell instances. The end result produces a cluster of real cell instances that form a desirable structure while minimizing the length of nets. The invention further discloses a non-uniform partitioning of a density map for calculating a force update vector. The partitioning is taken over a region A to compute Riemann sum approximations of a function F over the region A. A force update vector is calculated for a given cell instance within the region A where neighboring cell instances have an exponentially larger grid size as cell instances extend further away from the given cell instance.

8 Claims, 9 Drawing Sheets

OTHER PUBLICATIONS

F. Mo et al., A Force–Directed Macro–Cell Placer, IEEE/ACM Conference on Computer Aided Design, pp. 177–180, Nov. 2000.*

G. J. Wipfler et al., A Combined Force and Cut Algorithm for Hierarchical VLSI Layout, Proceedings of $19^{th}$ Design Automation Conference, pp. 671–677, Jun. 1982.*

H. Chen, Pseudo Pin Assignment for Single–Layer Over–the–Cell Routing, Proceedings of 1990 Conference on Computer Design: VLSI in Computers and Processors, pp. 343–346, Sep. 1990.*

C. J. Alpert et al., Faster Minimization of Linear Wirelength for Global Placement, IEEE Transactions on Computer–Aided Design of Integrated Circuits and Systems, pp. 3–13, Jan. 1998.*

Eisenmann, H., et al., Geheric Global Placement and Floor-planning, pp. 269–274, vol. 17.1, ACM, San Francisco, 1998.

Shahookar, K., et al, VLSI Cell Placement Techniques, ACM computing Surveys, Jun. 1991, pp. 143–220, vol. 23, ACM.

Fadavi–Ardekani, J., MXN Booth Encoded Multiplier Generator Using Optimized Wallace Trees, IEEE Transactions on very Large Scale Integration (VLSI) Systems, Jun. 1993, pp. 120–123, vol. 1, No. 2, IEEE.

Kim, J., et al., A Timing–driven Data Path Layout Synthesis with Integer Programming, Computer–Aided Design, 1995, pp. 716–719, 1063–6757105, IEEE.

* cited by examiner

| | | | | | | | |
|---|---|---|---|---|---|---|---|
| ⋮ | ⋮ | ⋮ | ⋮ ⋮ ⋮ ⋮ | ⋮ | ⋮ | | |
| A(3,3) | A(3,2) | A(3,1) | A(3,0) | A(3,-1) | A(3,-2) | A(3,-3) | ⋮ |
| A(2,3) | A(2,2) | A(2,1) | A(2,0) | A(2,-1) | A(2,-2) | A(2,-3) | ⋮ |
| A(1,3) | A(1,2) | A(1,1) | A(1,0) | A(1,-1) | A(1,-2) | A(1,-3) | ⋮ |
| A(0,3) | A(0,2) | A(0,1) | A(0,0) | A(0,-1) | A(0,-2) | A(0,-3) | ⋮ |
| A(-1,3) | A(-1,2) | A(-1,1) | A(-1,0) | A(-1,-1) | A(-1,-2) | A(-1,-3) | ⋮ |
| A(-2,3) | A(-2,2) | A(-2,1) | A(-2,0) | A(-2,-1) | A(-2,-2) | A(-2,-3) | ⋮ |
| A(-3,3) | A(-3,2) | A(-3,1) | A(-3,0) | A(-3,-1) | A(-3,-2) | A(-3,-3) | ⋮ |
| ⋮ | ⋮ | ⋮ | ⋮ ⋮ ⋮ ⋮ | ⋮ | ⋮ | | |

METHOD AND APPARATUS OF RELATIVE DATAPATH CELL PLACEMENT WITH STRUCTURE BONDING

BACKGROUND INFORMATION

1. Field of the Invention

The invention relates to computer-aided design (CAD) of integrated circuits, and particularly to placement of cells in datapath design.

2. Description of Related Art

Two general categories of placement methods are used, the first one random placement and the second one is structural placement. For random placement, cells are connected by list of nets. The objective of placement is to minimize a cost function that relates to total sum of net length with fixed constraints of placement area, routability, and timing. Several conventional placement algorithms relating to this type of placement method have been disclosed.

In bonding cell instances, a conventional solution places wires at locations between cell instances which produce shortest net lengths. Such approach produces an undesirable random or irregular structure arisen from the placement of uncorrelated cell instances. Another conventional solution places cell instances in a rigid structure by matching pin locations between cell instances. This technique is prohibitively restrictive since adjacent cell instances must be aligned with matching pin locations and hence introduces many dead placement spaces.

In a density map partitioning, conventional solution adopts a uniform grid partitioning. This approach requires substantial computation time in calculating the density forces of a given point on a partition map. Because each square or rectangle in the grid is uniform in size, the computation time is greater if the grid size of a cell instance is smaller which produces a high number of cells.

Accordingly, it is desirable to place cell instances in an optimized structure bonding. It is further desirable to have a density map partition which is non-uniform in computing a force update vector in reducing the extensive computational complexity time.

SUMMARY OF THE INVENTION

The invention discloses a relative placement of datapath elements by keeping the relativity of cell instances in a datapath group without rigid alignments between cells. In one embodiment, to encourage placement of a desirable structure, pseudo cells, pseudo pins, and pseudo nets are selected to be placed at certain locations with respect to real cell instances. The end result produces a cluster of real cell instances that form a desirable structure while minimizing the length of nets. The invention therefore achieves objectives of minimizing the sum of net lengths while encouraging cells instances to form in a desirable structure, such as a column structure, a row structure, or a square structure.

In a further aspect of the invention, a non-uniform partitioning of a density map for calculating a force update vector is disclosed. The partitioning is taken over a region A to compute Riemann sum approximations of a function F over the region A. A force update vector is calculated for a given cell instance within the region A where neighboring cell instances have an exponentially larger grid size as cell instances extend further away from the given cell instance.

Advantageously, the structure bonding reduces the dimension of a chip by minimizing dead placement spaces in a datapath structure for efficient utilization. Moreover, the structure bonding minimizes data skew of datapath. The structure bonding of cell instances with pseudo elements also encourages low timing delays. Additionally, the exponential portioning advantageously reduces significantly on the computational time in the determination of a force update vector on a given cell instances arisen from attractive and repelling forces.

DETAILED DESCRIPTION OF PREFERRED EMBODIMENT

Figure 1:
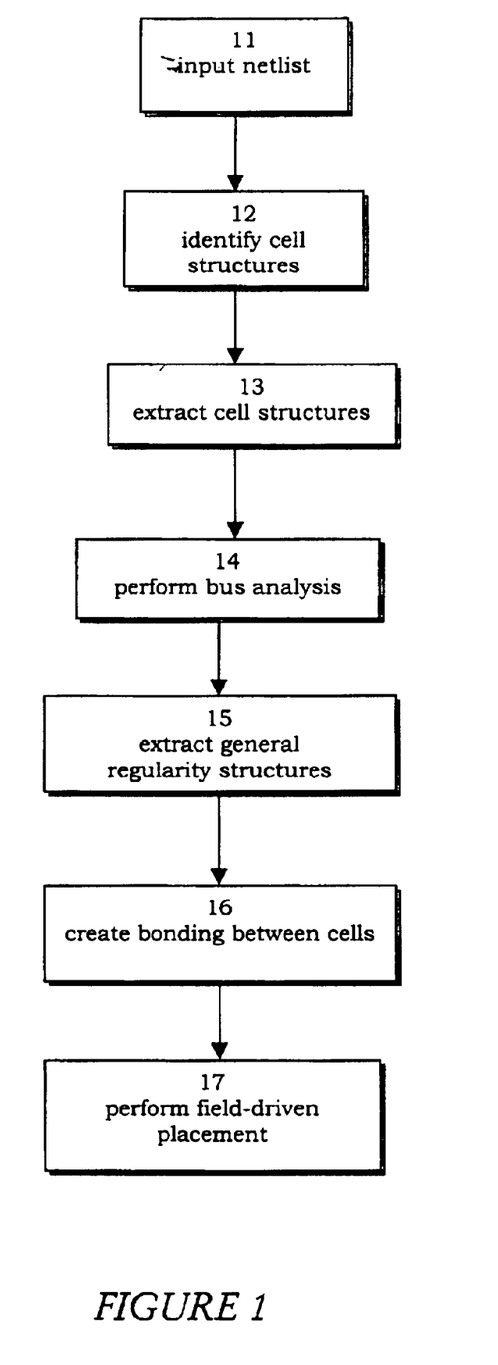
FIG. 1 is a flow diagram illustrating the general process in the placement of cell instances in accordance with the present invention.

FIG. 1 is a flow diagram of illustrating process steps by a placement engine 10 for the placement of cell instances in a structure bonding. Placement engine 10 processes placement steps so that each step generates a new placement based on an existing placement. Each placement step modifies an existing placement by combining attraction actions between connected cell instances with repulsive actions between cell instances. Placement engine 10 receives 11 an input netlist and identifies 12 cell structures from the netlist. Cell structures are extracted 13 from the netlist by placement engine 10 to perform 14 bus analysis. Placement engine 10 then extracts 15 general regularity structures and creates 16 bonding between the extracted cells. Subsequently, placement engine 10 performs 17 of field-driven placement of cell instances on a density partition map.

Figure 2A:
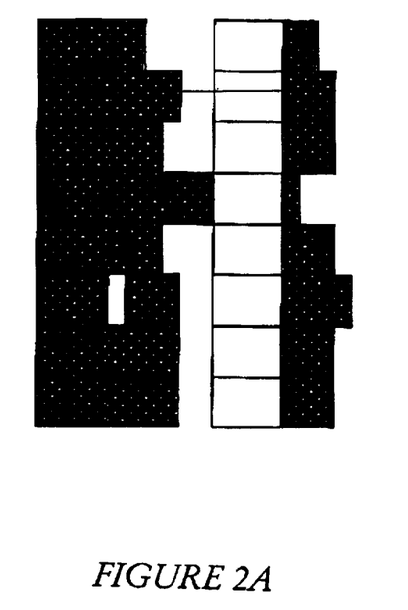
FIGS. 2A–B are pictorial diagrams illustrating relative cell placement of a column structure and a row structure in accordance with the present invention.
Figure 2B:
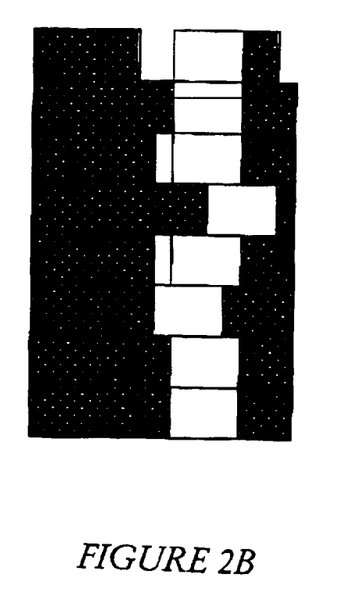

FIG. 2A is a pictorial diagram illustrating one fundamental relative structure in dapapath in a column structure 20. Column structure 20 embodies a vertical sequence of cell instances being fixed while horizontal distance between two cell instances is not fixed. Preferably in a column structure 20, cell instances are within the vicinity with one another. For example, in an 8-bit datapath, the binary "0" bit cell is placed at the bottom. The binary "1" cell is then placed above the binary "0" bit cell. This vertical sequence continues with the binary "2" bit cell being placed on top of the binary "1" cell until all eight cells are stacked in a chronological sequence from the lowest binary value to the highest binary value. Although the 8-bit vertical sequence in the datapath is fixed, cells that are horizontally adjacent to the 8-bit datapath have the flexibility to be placed in the vicinity, without being strictly aligned, to the eight vertical stacked cells. FIG. 2B is a pictorial diagram illustrating another fundamental relative structure in dapapath in a row structure 25. Row structure 25 embodies horizontal sequence of cell instances being fixed while vertical distance between two cell instances is not fixed. A further fundamental relative datapath structure is an array structure where both the horizontal sequence and vertical sequence are fixed. One skilled in the art should recognize that other type of structures or modifications can be practiced without departing from the scope of the invention.

Some terminologies used in describing the invention are defined as follows. A cell instance is an object which inhibits, typically a rectangular subset of a placement area. A net is an object which connects some set of cell instances. A pin is an object which represents the relative location in a cell instance's region where a net connection occurs. A placement is a mapping from a set of cell instances to a set of positions in a placement area. These positions can represent, for example, the centers or lower left corners of regions that cell instances inhibit. A placement area represents some subset of a two-dimensional real space, which is typically a bounded rectangle or rectilinear region. A total wire length in a placement is the value of some function that approximates the cost associated with the physical wire that connects to physical objects in which cell instances represent. The write length function is chosen to minimize the sum of half-perimeters of net bounding boxes. For each net, a minimal rectangle is found with horizontal and vertical edges that contain all pins associated that net, and add the width and height of that rectangle to a total wire length function. The utilization $\mu$ of a placement is the sum of areas of cell instances, divided by an area of the placement area. The utilization is typically between zero and one, and is independent of the positions of cell instances. A value of zero means that there are no cell instances, and that the placement area is empty. A value of one means that there is exactly enough room for all cell instances, and there would be no unused space if a cell instance can be placed without overlap.

Figure 3:
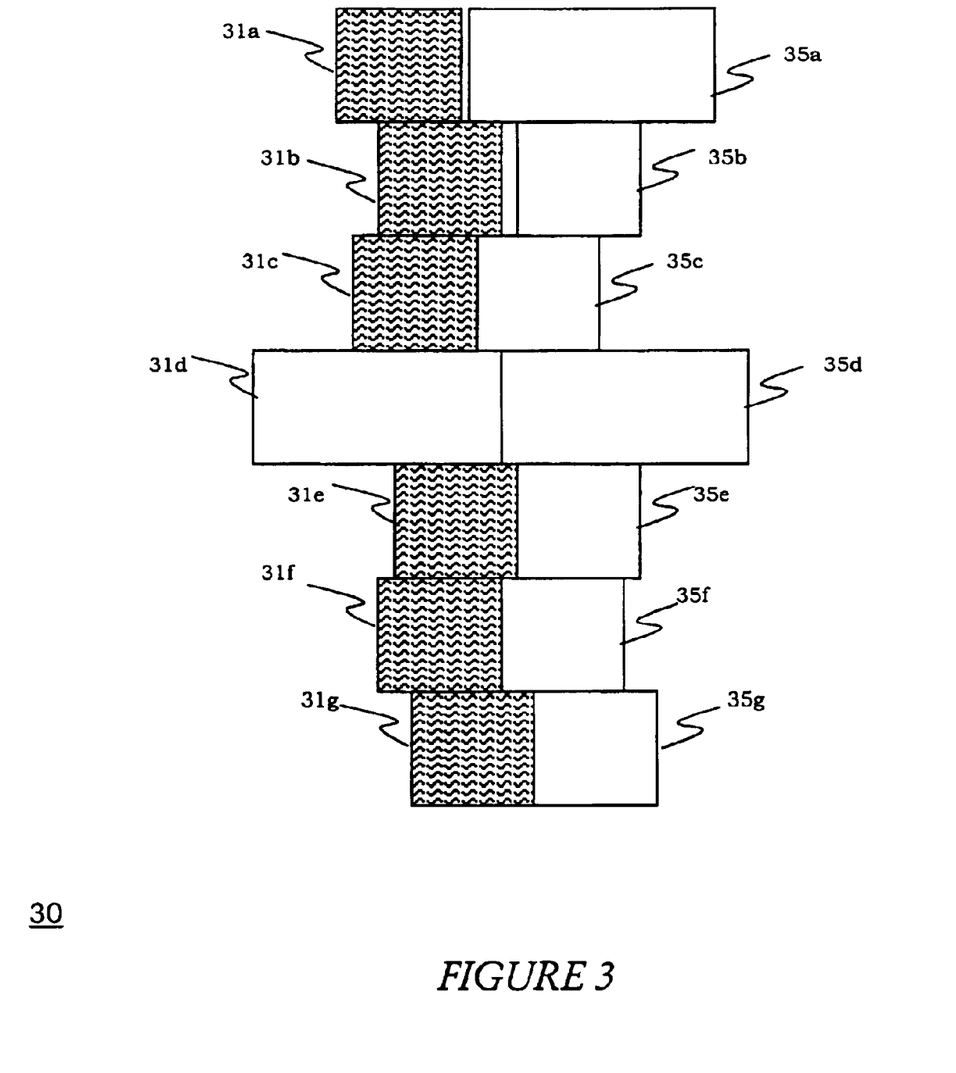
FIG. 3 is a pictorial diagram illustrating relative datapath placement in accordance with the present invention.

FIG. 3 is a pictorial diagram illustrating a structure bonding 30 of cell instances. Structure placement is to place a particular group of cell instances at certain locations that are relative to one another. Cell instances 31$a$–$g$ on the left side are concatenated to cell instances 35$a$–$g$ on the right side in a rectangular structure, even though cell instances 31$a$–$g$ are not perfectly aligned with cell instances 35$a$–$g$. Placement engine 10 places cells instances 31$a$–$g$ and 35$a$–$g$ with the aid of pseudo nets thereby producing structure bonding 30. Structure bonding 30 results in a zig-zag structure, the usage of pseudo nets encourage cell instances to form a structure without introducing extra dead placement spaces.

Figure 4A:
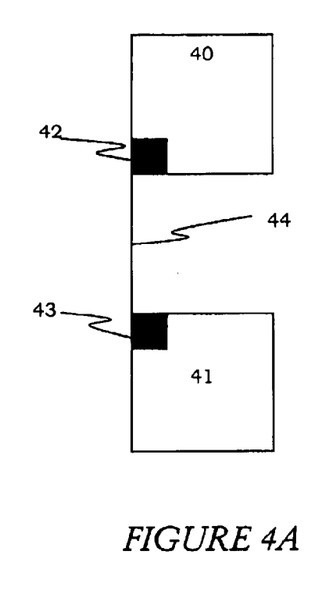
FIG. 4A is a pictorial diagram illustrating cell instances constructed with a pseudo net and pseudo pins in accordance with the present invention.

FIG. 4A is a pictorial diagram illustrating cell instances constructed with pseudo net and pseudo pins. The shortest distance between a cell instance 40 and a cell instance 41 is a straight line from the top of cell instance 41 to the bottom of cell instance 40. Therefore, a pseudo pin 42 is placed in bottom of cell instance 40 for connecting with a pseudo pin 43 at the top in cell instance 41. A pseudo net 44 connects between pseudo pin 42 and pseudo pin 43 together while minimizing the length of wire interconnect. Although pseudo pins 42, 43 and pseudo 44 do not actually exist, pseudo net 44 and pseudo pins 42, and 43 are treated as real nets and pins for encouraging the placement of cell instances in a structure.

A pseudo cell instance $c_f$ 48 is added with a width and height equal to zero, without interfering with a density map. The pseudo cell instance $c_f$ 48 is assigned to a position on the density map to encourage a desirable structure. Between pseudo cell instance, $C_f$ and real cell instances $c_1, c_2, \ldots c_k$, a set of $\overline{d}_1, \ldots, \overline{d}_k$ relative positions is created and satisfies: $\overline{x}_j = \overline{x}_f + \overline{d}_j$ for all j, where the term $\overline{x}_f$ denotes an optional pseudo instance and the term $\overline{d}_j$ denotes a relative position.

Figure 4B:
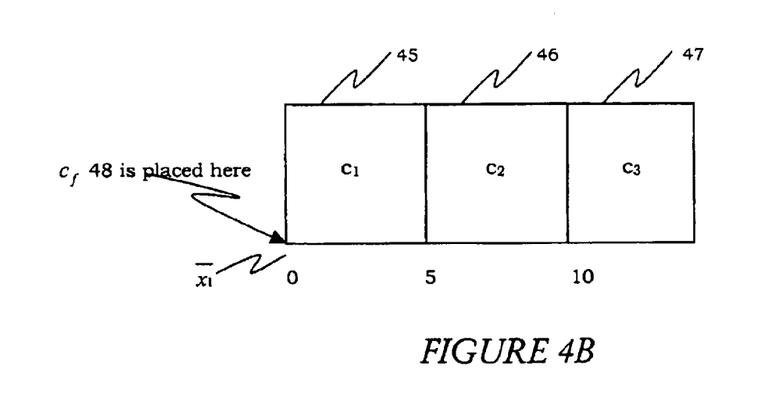
FIG. 4B is a graphical diagram illustrating cell instances with relative positioning in accordance with the present invention.

An example is shown in FIG. 4B. A set of thee cell instances $c_1$ 45, $c_2$ 46, and $c_3$ 47, each represents a square of five units in length and width. The three cell instances $c_1$ 45, $c_2$ 46, and $C_3$ 47, are aligned in a cascaded row. If the lower left corner of $c_1$ 45 is at a location $\overline{x}_1$, then cell instance $c_2$ 46 has a lower left corner at $\overline{x}_2 = \overline{x}_1 + (5,0)$, and cell instance $c_3$ 47 has a lower left corner $\overline{x}_2 = \overline{x}_1 + (10, 0)$. In this example, pseudo cell instance $c_f$ 48 is created for sharing the location $\overline{x}_1$ with the lower left corner of $c_1$. Induce relative position are computes as $\overline{d}_1 = (0, 0)$ between $c_f$ 48 and $c_1$ 45, $\overline{d}_2 = (0,5)$ between $c_f$ 48 and $c_2$ 46, and $\overline{d}_3 = (0,10)$ between $c_f$ 48 and $c_3$ 47.

Upon determining the relative positions between the new pseudo cell instance and real cell instances, new pseudo nets are created to bond the new pseudo cell instance and real cell instances. Although several techniques are used to construct pseudo nets, the preferred technique is to select a connection which minimizes wire lengths. For example, a simple net is used to construct cell instances in a structure. If, however, large nets are given lower weights than small nets, then the bonding effect gained by the net may be diminished. In such scenario, two-pin nets may be created among cell instances. The pins of nets are placed at locations that encourages a desire relative placement of the structure.

In assigning relative locations of pins to their corresponding cell instances, pins associated with the pseudo or fake cell instance $c_f$ 48 are placed at a relative location of (0, 0) from the position of $c_f$ 48. Subsequently, a pin that is associated with a real to instance $c_j$ may be assigned to a relative position of $-\overline{d}_j$ from $c_j$. If a relative location of (0, 0) is not assigned to the pseudo cell instance's pin, then the difference of these relative locations is $\overline{d}_f$, i.e. $\overline{p}_f - \overline{p}_j = \overline{d}_j$ where $\overline{p}_f$ represents the location of $c_f$'s pin relative to $\overline{x}_f$, while $\overline{p}_j$ represents the location of $c_j$'s pin relative to $\overline{x}_j$.

Continuing with the example above, three fake nets $n_1, n_2$, and $n_3$ which connect $c_f$ to, respectively, $c_1$ 45, $c_2$ 46, and $c_3$ 47. If a pin is placed for each net at a location of (0, 0) relative to the pseudo cell instance, a pine for $n_1$ is place at $-\overline{d}_1 = (0, 0)$ relative to $c_1$, a pine for $n_2$ is place at $-\overline{d}_2 = (0, -5)$ relative to $c_2$, and a pine for $n_2$ is place at $-\overline{d}_3 = (0, -10)$ relative to $c_3$.

Preferably, placement engine 10 attempts to make pseudo nets as short as possible between cell instances. The shortest possible net is one with a length of zero, in which all of the net's pins are at the same position $\overline{z}$. For example, if $c_j$ is a real member of such a net, and if pins are placed at $\overline{p}_j$ relative to $\overline{c}_j$ and $\overline{p}_f$ relative to $\overline{c}_f$, then a desirable result is achieved $\overline{x}_j = \overline{x}_f + \overline{p}_f - \overline{p}_j = \overline{x}_f + \overline{d}_j$, where $\overline{z} = \overline{x}_j + \overline{p}_j = \overline{x}_f + \overline{p}_f$. The optimal structure is to have all pseudo nets have zero length so that cell instances in a structure have exactly the desirable relative positions.

Optionally, rather than constructing pseudo cell instances, pin offset vectors can be assigned as if a pseudo instance existed. Each cell instance in the structure is connected to surrounding cell instances by a path of pseudo nets.

Members of a structure may be scattered if real nets connecting to cell instances overpowers pseudo nets. In such scenario, placement engine 10 increases the weight of pseudo nets to reduce the effect of undesirable structure. In one embodiment, the weights of pseudo net are set equal to the weights of real nets to maintain structure cohesion.

Figure 5:
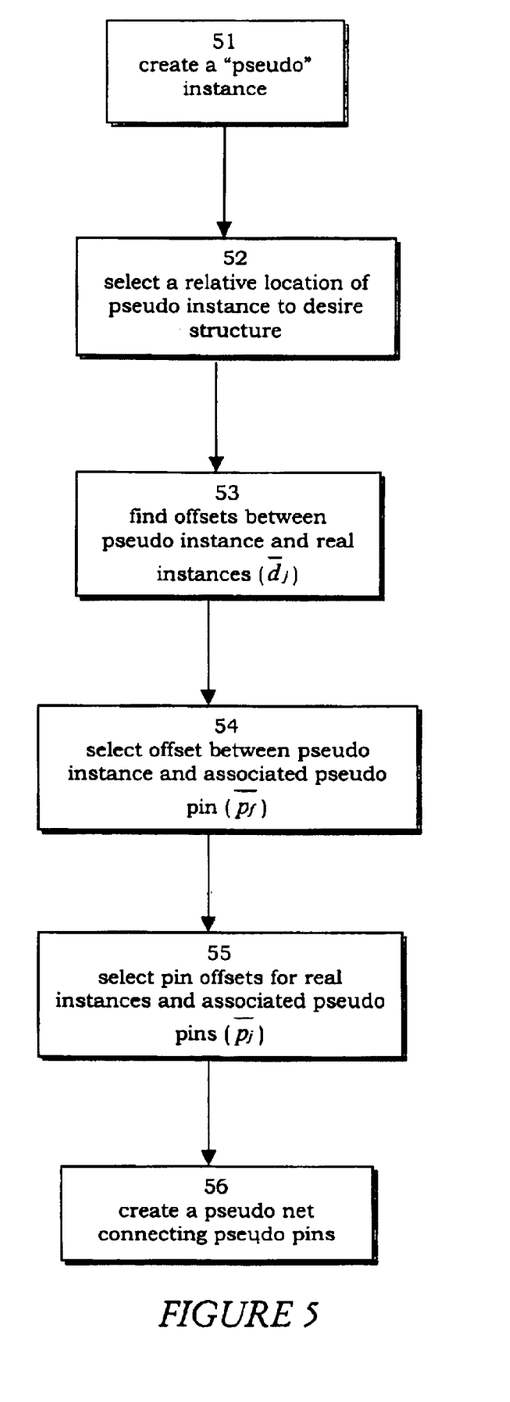
FIG. 5 is a pictorial diagram of one embodiment in field driven placement with positive and negative charge particles in accordance with the present invention.

FIG. 5 is a flow diagram illustrating the process of structure bonding 50 in accordance with the present invention. A pseudo instance is created 51 and selects 52 at a relative location to encourage structural placement. Placement engine 10 finds 53 offsets between pseudo instance and real instances, represented by the symbol $\bar{d}_j$. Subsequently, placement engine 10 selects offset between pseudo instance and the associated pseudo pin, $\bar{p}_f$. After pin offsets are selected 55 for real instances and their associated pseudo pins, $\bar{p}_j$, placement engine 10 creates a pseudo net connecting pseudo pins.

Figure 6:
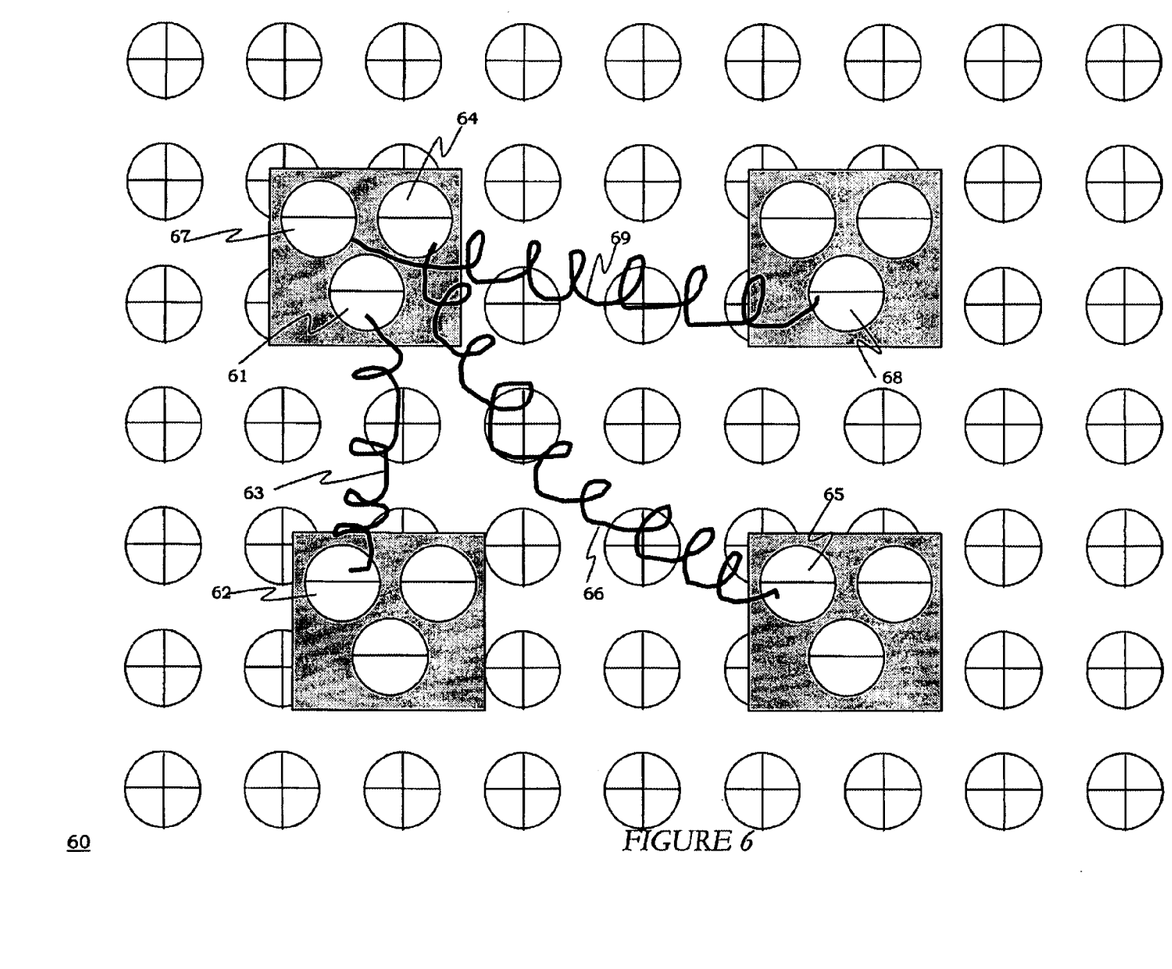
FIG. 6 is a flow diagram illustrating the process in a structure bonding in accordance with the present invention.

FIG. 6 is a pictorial diagram of one embodiment in a field driven placement 60 with positive and negative charge particles. Particles 61 and 62 are tied together with a spring 63. Similarly, particles 64 and 65 are connected with a spring 66. Also, a spring 69 ties particles 67 and 68. Placement engine 10 balances different objectives through a sequence of placement steps. Each placement step modifies the placement by combining attractive actions between connected cells with repulsive actions between cell instances. Attractive actions serve to optimize objective functions while repulsive actions serve to reduce overlap among cell instances. The name "field driven placement" encompasses positively charged particles placed in a negatively charged field. The particles are tie together with springs. The objective is to minimize the following function:

$$\min \sum_{ij} w_{ij} r^2 + \frac{\in}{2} \int E^2 d\tau \qquad \text{Eq. (1)}$$

The term $r^2$ in Equation 1 represents the energy of a spring, which can also be written as $(x_i-x_j)^2+(y_i-y_j)^2$. The additional term of $\in/2 \int E^2 \tau$ represents the energy of the field. To minimize Equation 1, a vector differentiation is taking on the expression on all movable objects location. The derived Equation 1 becomes: $A\bar{x}+\bar{b}+\overline{F_x}=0$, and $A\bar{y}+\bar{b}+\overline{F_y}=0$, where $(A\bar{x}+b, A\bar{y}+b)$ represents the spring force and $(F_x, F_y)$ represents the electrical force.

The derived Equation 1 can be interpreted in which the sum of an overall force is equivalent to zero at equilibrium stage. The electrical force is then expressed as follows: $\overline{F_x}(x,y)=\overline{F_{xa}}(x,y)+\overline{F_{xr}}(x,y)$ and $\overline{F_y}(x,y)=\overline{F_{ya}}(x,y)+\overline{F_{yr}}(x,y)$. The term $F_{xa}(x, y)$ represents the force due to attractive force of the positive plane, while $\overline{F_{xr}}$ represents the repelling force from other cell instances, and thus $\overline{F_c}(x,y)=\{\overline{F_{xa}}(x,y), \overline{F_{ya}}(x,y)\}$, $\overline{F_r}(x,y)=\{\overline{F_{xr}}(x,y), \overline{F_{yr}}(x,y)\}$. Cell instances move in a plane. According to Gauss's Law:

$$\in \oint E dS = q \Rightarrow E = \frac{q\hat{r}}{2\pi \in r}.$$

The attraction force $F_a$ can be calculated as follows:

$$Fa(x, y) \approx \frac{Ak}{2\pi \in} \int_l^w \int_b^t \frac{\hat{r}}{r} dx dy,$$

where symbols l and w represent the left and right boundaries in a placeable area, and b and t represents the top and bottom boundaries in the placeable area. Similarly, the repulsive force acting upon a cell is computed as the summation of the repulsive force from other cells:

$$F_r(x, y) \approx -\sum_j \frac{Ak}{2\pi \in} \int_{xj-\frac{w}{2}}^{xj+\frac{w}{2}} \int_{yj-\frac{h}{2}}^{yj+\frac{h}{2}} \frac{\hat{r}}{r} dx dy.$$

An force update vector is an accumulation of repulsive actions upon a given cell instance by other cell instances. These actions are determined such that cell instances are pushing away from high density regions while pulling towards low density regions. The constant value of k affects the strength of the force update vector. Low values of k reduce the tendency of placement engine 10 to favor overlap reduction over the optimization of objective functions, with a tradeoff against runtime in computing a greater number of force update vectors. High values of k presents a converse issue, in which a poor solution is achieved quickly.

Another way to characterize the placement step and the computation of an force update vector is described as follows. An initial placement step is to update a force vector $\bar{f}_c$ for each cell instance c, which is used as an offset vector when finding that instance's location. The force vector $\bar{f}_c$, which is initially set to zero, is additively updated during each placement step by repulsive actions from other cell instances, as well as attractive actions from the placement area.

The subsequent placement step comprises an iterative process of a small number of intermediate updates of placement. Each intermediate updates include two phases, one which determines virtual positions of the nets and one which determines the positions of the cell instances. The first phase of the intermediate update finds a virtual positions $\bar{x}_n$ for each net n which connects a set of cell instances $\{c_1, \ldots, c_j\}$. The position is obtained by computing a weighted average of instances' positions:

$$\bar{x}_n = \frac{\sum_{i=1}^{j} w_i \cdot \bar{x}_{c_i}}{\sum_{i=1}^{j} w_i}$$

where $\{w_1, \ldots, w_j\}$ are non-negative cell instance weights. A constant weight of 1 is typically used.

During the second phase, an intermediate position $\bar{x}_c$ is found for each cell instance c. This position is a shifted weighted average of the virtual positions of the nets $\{n_1, \ldots, n_k\}$ which are connected to c. The weighted average is shifted by the force vector which is computed at the outset of placement steps:

$$\bar{x}_c = \frac{\sum_{i=1}^{k} w_i \cdot \bar{x}_{n_i}}{\sum_{i=1}^{k} w_i} + \bar{f}c$$

where $(w_1, \ldots, w_k)$ are nonnegative net weights. Typically, the weight $w_i$ is some $(2/p)^k$ where p is the pin count of the net $n_i$ (i.e. the number of cell instances which are connected to $n_i$), and k is some non-negative integer. By starting with k=0 and gradually increasing to k=2, the total overall wire length is minimized when making transition from a randomly chosen placement to another placement.

Optionally, each net is associated with a force vector which is used as an offset for that net's virtual position, and cell instance positions receive no such offset. This method is referred to as dual placement.

At each placement step, the force vector associated with each cell is updated. The update involves a multiplication by a force trimming scalar first, followed by an addition with a force update vector. The force trimming scalar is typically some real number between zero and one and determines the balance between competing goals of discouraging overlap and optimizing objective functions. Values that are close to 0 encourage shortening nets, while values that are close to 1 encourage cell instances to spread out. The force update vector represents an accumulation of repulsive actions upon a given cell instance by other cell instances. Repulsive actions are determined so that cell instances are pushed away from high density regions and pulled towards low density regions. The force update vector is represented as follows:

$$\overline{e}(\overline{x}) = \frac{k}{2\pi} \int \int D(\overline{x}') \cdot \frac{\overline{x} - \overline{x}'}{\|\overline{x} - \overline{x}'\|} d\overline{x}'$$

where k represents some constant, and D represents a density function. The integral is taking over an entire placement area, or all of two-dimensional space as long as the density function is uniformly zero outside the placement area. The force update vector $\overline{e}_c$, associated with a cell instance c is then given by $\overline{e}(\overline{x}_c)$, where $\overline{x}_c$ is the position of c. The constant value k affects the strength of the force update vector. A low value of k reduces the tendency of placement engine 10 to favor overlap reduction over optimizing objective functions at the expense of runtime. A greater number of force update vectors is computed. A high value of k have the opposite concerns, which achieves poor solutions quickly. In one embodiment, a value of $$\frac{3}{1000 \cdot \mu}$$

is used where $\mu$ represents the utilization of the placement.

A density function D maps a given position $\overline{x}'$ in the placement area to a value which is given by the number of cell instances which cover the position $\overline{x}'$, less the utilization of the placement:

$$D(\overline{x}') = \sum_c \chi_c(\overline{x}') - \mu,$$

where $\chi_c$ represents the characteristic function associated with the region that instance c inhabits, i.e. $\chi_c(\overline{x}')$ equals one if the position $\overline{x}'$ is covered by c, and otherwise equals to zero. The subtraction of the utilization from the sum of the characteristic functions serves to provide an attractive action upon cell instances towards regions with low density.

Figure 7:
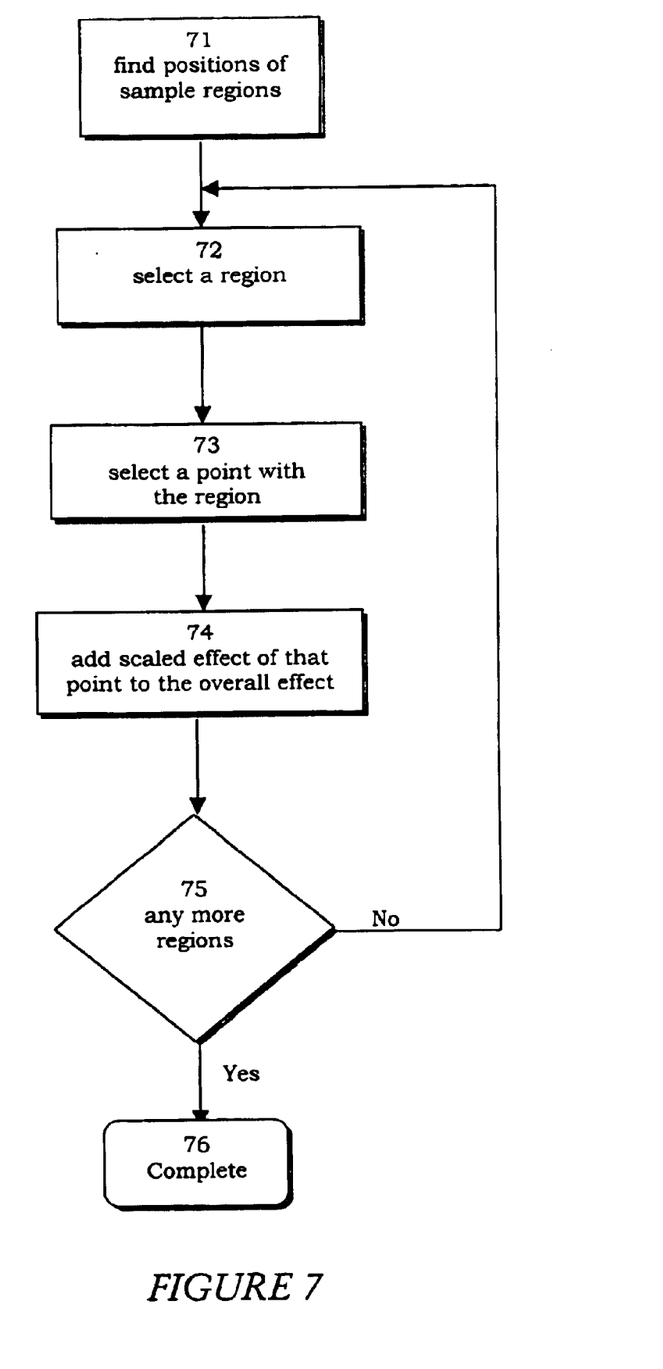
FIG. 7 is a flow diagram illustrating the process of a Riemann sum approximation of the force update vector in accordance with the present invention.

The integral in the force update vector is computed through a Riemann sum approximation. FIG. 7 is a flow diagram of this process 70. The placement engine 10 finds 71 the positions of the sample regions and selects 72 a region. Within that region, the placement engine 10 selects 73 a given point to serve as a representative for computing the part of the force update vector which represents attractive and repulsive actions in that region. The placement engine 10 adds a scaled effect of that point to the overall effect. If there are more regions, the process 70 returns to the operation 72. Otherwise, the placement engine 10 completes the process 70 in a step 76.

To approximate the integral of a function F over some region A, the region A may be partitioned into a collection of pairwise disjoint subregions $A_1, \ldots, A_k$, and then representative points $a_1, \ldots, a_k$ may be chosen so that $a_j \in A_j$ for all $j=1, \ldots, k$. If $\|A_j\|$ represents the area of region $A_j$, then the corresponding Riemann sum approximation $$\int_A F \text{ is: } \sum_{j=1}^k F(a_j) \cdot \|A_j\|.$$

Riemann sums are typically computed by dividing a region A into a rectangular grid, where subregions occupy an equal area. Representative points can be chosen to be corners, centers, random locations, or places where the function to be integrated is minimized or maximized. To make the computation of the force update vector more efficient, the placement area is divided into such a uniform grid, and store a density map that indicates, for each uniform region in the grid, the cell density within that region. This partition is called the density map partition.

There are some drawbacks to using a uniform grid of regions in the computation of the force update vector. Selecting a small grid size promotes accuracy in Riemann sum approximation, but with a severe cost in computation time. Conversely, selecting a large grid size reduces the computational time of force update vectors, but allows for a large amount of irregularity in the cell density within the regions. For example, if 10,000 cell instances are to be placed in an area that is partitioned into two subregions, with 5,000 cell instances for each subregion, then the placement may be categorized as uniform if each of the regions has its 5,000 cell instances occupying the representative position chosen for that region.

To avoid the difficulties arising from the use of a uniform partition in the Riemann sum approximation, a non-uniform partition is chosen whose members are made up of groups of smaller density map grid elements. To this end, a convenient labeling system is established for the density map partition elements base on rows and columns. Given a model rectangle E, the two-dimensional plane is tiled with a grid of copies $(E_{ij}|ij \in Z)$ of E, with the following order: $i_0 < i_1$ if and only if $E_{i_0,j}$ is left of $E_{i_1,j}$ for all j; and $j_0 < j_1$ if and only if $E_{i,j_0}$ is below of $E_{i,j_1}$ for all i. Without loss of generality, the $E_{0,0}$ region may be placed at any location on the placement area, such as at the lower left corner.

The density map partition induces a map $\epsilon: Z^2 \rightarrow R$ such that $\delta(i,j)$ is equal to the cell instance density in $E_{i,j}$. For example, if $E_{4,7}$ contains 3 area units of cell instance $c_1$, and 2.4 area units of cell instance $c_2$, and no other cell instances intersect $E_{4,7}$, then $\delta(4, 7)=3+2.4=5.4$. This map, less the utilization $\mu$, is used as the density function D in the Riemann sum calculation of the force update vector.

In describing a non-uniform partition used in Riemann sum approximation, two families of intermediate partitions are described to induce a final partition by way of intersections of intermediate partition members. The intermediate partitions divide a plane into either horizontal or vertical stripes, with a central thin strip that is surrounded by increasingly thick stripes.

Given a density map partition $\{E_{ij}|i,j\in Z\}$, a base index $i_0 \in Z$, and $m \in Z$, $V_{i_0}(m)$ can be defined as, the $m^{th}$ vertical stripe about $i_0$, as follows:

$$V_{i_0}(0) = \cup\{E_{i_0,j}|j \in Z\}$$

$$V_{i_0}(m) = \cup\{E_{i_0+k,j}|j \in Z, \text{ and } 2^{m-1} \leq k < 2^m\} \text{ for } m>0$$

$$V_{i_0}(-m) = \cup\{E_{i_0-k,j}|j \in Z, \text{ and } 2^{m-1} \leq k < 2^m\} \text{ for } m>0$$

Similarly given a base index $j_0 \in Z$, and $n \in Z$, $H_{j_0}(n)$ can be defined, the $n^{th}$ horizontal stripe about $j_0$, as follows:

$$H_{j_0}(0) = \cup\{E_{i,j_0}|i \in Z\}$$

$$H_{j_0}(n) = \cup\{E_{i,j_0+k}|j \in Z, \text{ and } 2^{n-1} \leq k < 2^n\} \text{ for } n>0$$

$$H_{j_0}(-n) = \cup\{E_{i,j_0-k}|i \in Z, \text{ and } 2^{-1} \leq k < 2^n\} \text{ for } n>0$$

To verify the families of vertical stripes and horizontal strips: let $i_0 \in Z$. The collection $\{V_{i_0}(m)|m \in Z\}$ is a partition of a plane. For $m>0$, the width of $V_{i_0}(m+1)$ is twice that of $V_{i_0}(m)$, and $2^m$ times that of $V_{i_0}(0)$. For $m<0$, the width of $V_{i_0}(m-1)$ is twice that of $V_{i_0}(m)$, and $2^{-m}$ times that of $V_{i_0}(0)$.

In the Riemann sum calculation of a force update vector, the exponential partition is defined as follows. Given a base index $(i_0,j_0) \in Z^2$, and integers m and n, $A_{i_0j_0}(m,n)$ can be defined, the $(m, n)^{th}$ exponential partition member, as $V_{i_0}(m) \cap H_{j_0}(n)$. If there is no uncertainty about the values of $i_0$ and $j_0$, then the abbreviation of A (m, n) is used.

Figure 8:
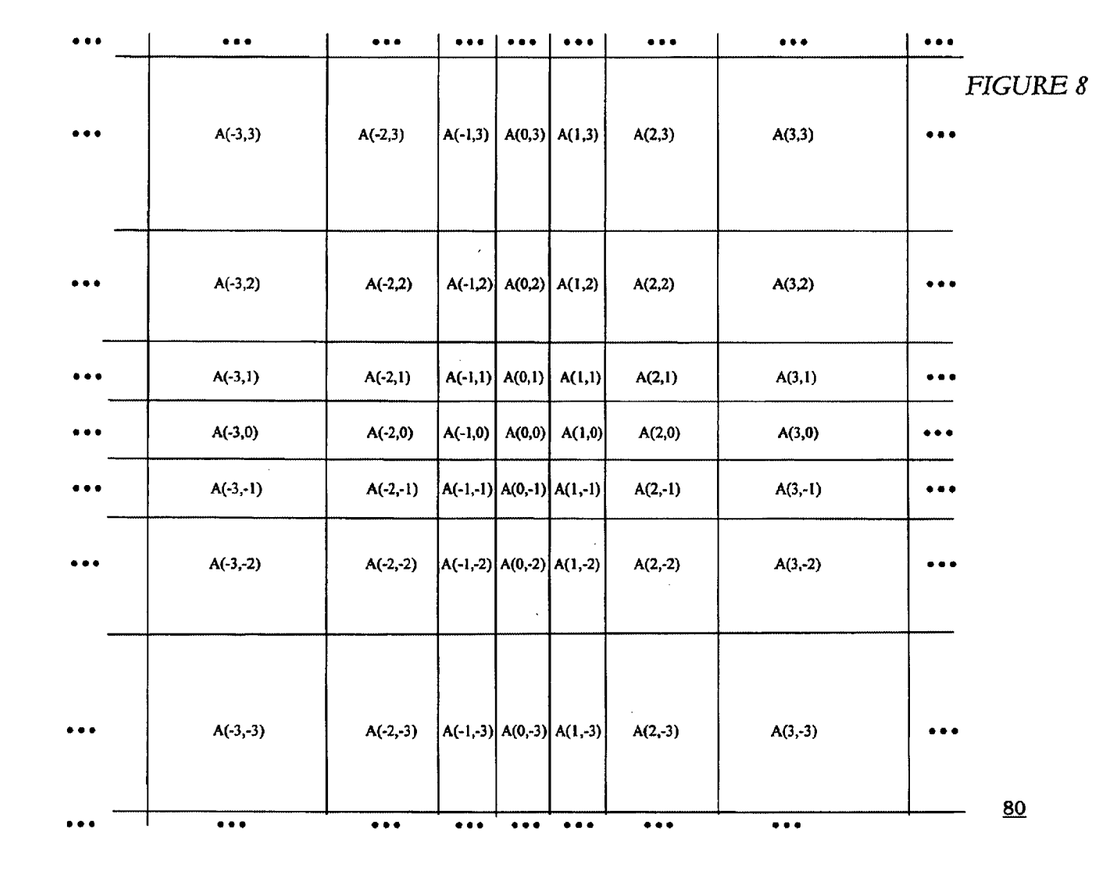
FIG. 8 is a pictorial diagram illustrating one embodiment of an exponential field sampling partition in accordance with the present invention.

The exponential partition members are so named because their areas increase exponentially as the indices m and n move away from zero. Let $(i_0, j_0) \in Z^2$. Then, $A_{i_0,j_0}(0,0) = E_{i_0,j_0}$. The collection $\{A(m,n)|m,n \in Z\}$ is a partition of the plane. For m>0 and n>0, the area of A(m+1, n+1) is $2^{m+n}$ times that of A(0,0). FIG. 8 is a pictorial diagram of one embodiment in implementing an exponential field sampling partition.

The force update vector of a given cell instance c is then computed as described below. Let $E_{i_0,j_0}$ represent the density map partition that contains the center $\bar{x}$ of c. Representative locations are selected $\{\bar{x}_{m,n}|m, n \in Z\}$ so that $\bar{x}_{m,n} \in A_{i_0,j_0}(m, n)$ for all m and n in Z. For each m and n in Z, the integers $i_m$ and $j_n$ are found such that $\bar{x}_{m,n} \in E_{i_m,j_n}$. A term D(m, n) is defined to be zero for m and n in Z if $E_{i_m,j_n}$ does not intersect the placement area; otherwise, D(m, n) is define as $\delta(i_m, j_n)-\mu$, where $\delta$ represents the density map and $\mu$ represents the utilization of the placement. The resulting Riemann sum approximation is as follows:

$$\int\int D(\bar{x}') \cdot \frac{\bar{x}-\bar{x}'}{\|\bar{x}-\bar{x}'\|} d\bar{x}' \cong \sum_m \sum_n D(m,n) \cdot \frac{\bar{x}-\bar{x}_{m,n}}{\|\bar{x}-\bar{x}_{m,n}\|} \cdot \|A(m,n)\|$$

Preferably, representative locations are selected randomly to avoid undesirable clustering of the cell instances.

Figure 9:
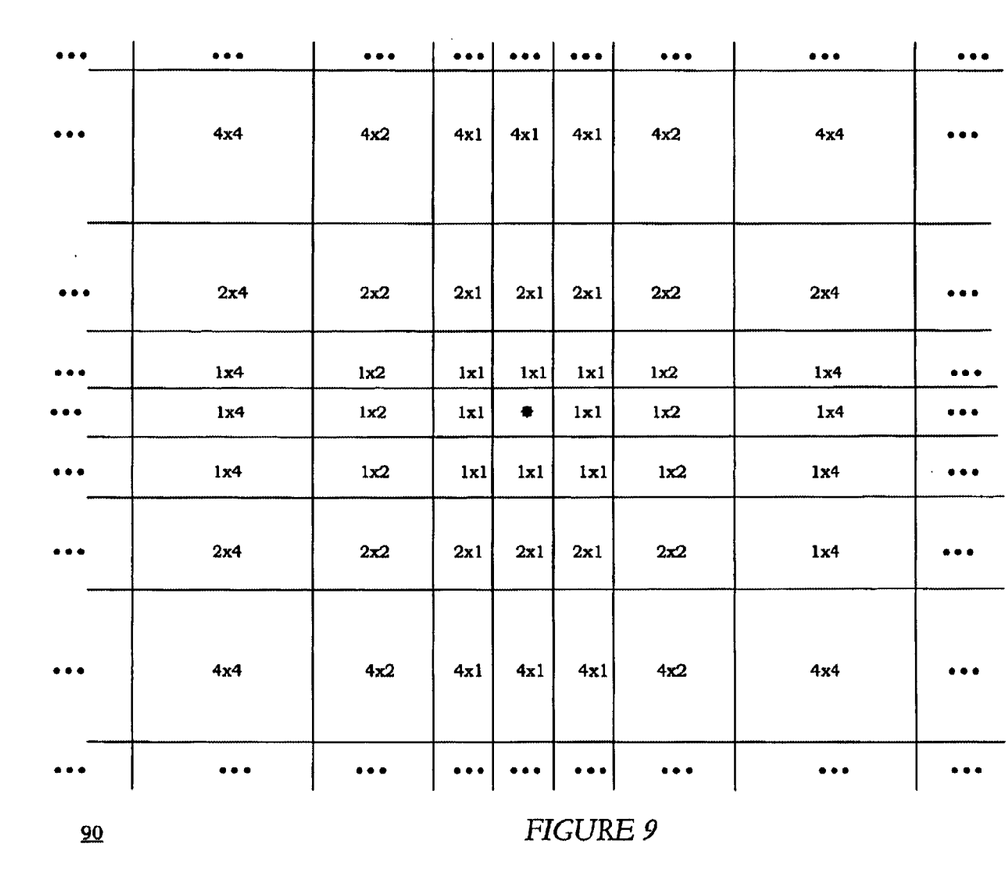
FIG. 9 is a pictorial diagram illustrating one embodiment of an exponential field sampling partition in accordance with the present invention.

FIG. 9 is a pictorial diagram of an example of one embodiment in implementing an exponential field sampling partition. A given cell instance, denoted by the symbol ✸, is selected, along with its region in the density map which will serve as a central region. Each of the eight regions immediately surrounding the point ✸ is a 1×1 region unit. Moving outward, the size of a region increases exponentially, from 2 units, to 4 units, and more. The farther away a square or rectangle is from the point ✸, the larger the sampling area. Because a single sampling point is chosen for each region, the larger (and thus farther) regions take less processing time per unit of area than the smaller (and closer) regions do. The choice of a single sampling point for a larger region, for example a 4×4 region, also reduces the accuracy of the estimation of that region's effect in the force update vector, but this lack of accuracy is offset by the fact that such regions are far from ✸ and, because of the inverse-distance-squared term in the force update vector, have a smaller effect per unit of area on ✸ than a closer region, such as a 2×1 region.

The above embodiments are only illustrative of the principles of this invention and are not intended to limit the invention to the particular embodiments described. For example, variations of pseudo elements may be used to encourage cell instances to be placed in a structure bonding. Furthermore, the exponential partitioning of a density map may have various assigned ratios that are not necessarily powers-of-two. Accordingly, various modifications, adaptations, and combinations of various features of the described embodiments can be practiced without departing from the scope of the invention as set forth in the appended claims.

We claim:

1. A datapath structure, comprising:

one or more cell instances, each cell instance having a pin;

one or more pseudo cell instances, each pseudo cell instance having a pseudo pin, each pseudo cell instance in the one or more pseudo cell instances being placed at a location relative to the one or more cell instances in encouraging a predetermined structure; and one or more pseudo nets, a first pseudo net connecting between a pin of a first cell instance in the one or more cell instances and a pin in a first pseudo cell instance in the one or more pseudo cell instances, wherein the first pseudo cell instance being placed at a location relative to the first real cell instance produces a zero or greater than zero length in the first pseudo net.

2. The structure of claim 1 further comprising a first relative position between the first cell instance and the first pseudo cell instance.

3. The structure of claim 1 wherein the predetermined structure comprises a column structure, a row structure, or a square structure.

4. A computerized method for encouraging a structure bonding, comprising the steps of:

placing a first pseudo cell instance at a location relative to a first cell instance in a plurality of cell instances for encouraging a predetermined structure bonding in the plurality of cell instances;

connecting a pseudo net between the cell instance and the pseudo cell instance; and providing a first offset between the pseudo cell instance and the first cell instance.

5. The method of claim 4 further comprising the step of minimizing a wire length in the pseudo net from the placement of the first pseudo cell instance relative to the first cell instance.

6. The method of claim 4 wherein the predetermined structure comprises a column structure, a row structure, or a square.

7. A computerized method for encouraging a structure bonding, comprising:

placing a first pseudo cell instance at a location relative to a first cell instance in a plurality of cell instances for encouraging a predetermined structure bonding in the plurality of cell instances;

connecting a pseudo net between the cell instance and the pseudo cell instance;

providing a first offset between the pseudo cell instance and the first cell instance; and determining a second offset between the pseudo cell instance and a second cell instance in the plurality of cell instances.

8. A computerized method for encouraging a structure bonding, comprising:

placing a first pseudo cell instance at a location relative to a first cell instance in a plurality of cell instances for encouraging a predetermined structure bonding in the plurality of cell instances; and connecting a pseudo net between the cell instance and the pseudo cell instance;

wherein the placing step comprises the step of placement without introducing extra dead placement spaces.

* * * * *